United States Patent
Barber et al.

(10) Patent No.: US 6,937,018 B2
(45) Date of Patent: Aug. 30, 2005

(54) SYSTEMS AND METHODS FOR FABRICATING POLE PIECES FOR MAGNETIC RESONANCE IMAGING SYSTEMS

(75) Inventors: William Daniel Barber, Clifton Park, NY (US); Bulent Aksel, Clifton Park, NY (US); Peter George Frischmann, Pocatello, ID (US)

(73) Assignee: General Electric Company, Niskayuna, NY (US)

( * ) Notice: Subject to any disclaimer, the term of this patent is extended or adjusted under 35 U.S.C. 154(b) by 58 days.

(21) Appl. No.: 10/699,185

(22) Filed: Oct. 31, 2003

(65) Prior Publication Data

US 2005/0093542 A1 May 5, 2005

(51) Int. Cl.⁷ .................................................. G01V 3/00
(52) U.S. Cl. ....................................... 324/319; 324/318
(58) Field of Search .............................. 324/319, 318, 324/322, 309, 307; 335/297

(56) References Cited

U.S. PATENT DOCUMENTS

| | | | | |
|---|---|---|---|---|
| 3,078,198 A | * | 2/1963 | Wiener ........................ 148/111 |
| 3,248,781 A | * | 5/1966 | Jones .......................... 29/605 |
| 5,283,544 A | | 2/1994 | Sakurai et al. .............. 335/297 |
| 6,083,326 A | * | 7/2000 | Komatsubara et al. ...... 148/308 |
| 6,150,818 A | | 11/2000 | Barber ........................ 324/325 |
| 6,150,819 A | | 11/2000 | Laskaris et al. ............. 324/319 |
| 6,259,252 B1 | | 7/2001 | Laskaris et al. ............. 324/319 |
| 6,444,050 B1 | * | 9/2002 | Komatsubara et al. ...... 148/111 |
| 6,444,051 B2 | * | 9/2002 | Komatsubara et al. ...... 148/111 |
| 6,602,357 B2 | * | 8/2003 | Senda et al. ................. 148/308 |
| 2002/0134466 A1 | | 9/2002 | Namikawa et al. | |
| 2002/0157734 A1 | | 10/2002 | Senda et al. | |
| 2002/0195172 A1 | | 12/2002 | Arai et al. | |
| 2003/0121566 A1 | | 7/2003 | Komatsubara et al. | |

* cited by examiner

*Primary Examiner*—Brij B. Shrivastav
(74) *Attorney, Agent, or Firm*—Fletcher Yoder

(57) ABSTRACT

An imaging system including at least one pole piece is described. The at least one pole piece includes at least two grain-oriented sheets that are stacked together, where a direction of easy magnetization of a first of the at least two grain-oriented sheets is different than a direction of easy magnetization of a second of the at least two grain-oriented sheets.

16 Claims, 7 Drawing Sheets

SYSTEMS AND METHODS FOR FABRICATING POLE PIECES FOR MAGNETIC RESONANCE IMAGING SYSTEMS

BACKGROUND OF THE INVENTION

This invention relates generally to imaging systems and more particularly, to pole pieces used with magnetic resonance imaging (MRI) systems.

At least some known MRI systems include pole pieces and magnets which are used to generate magnetic fields that are applied via the pole pieces to an imaging volume, such as a patient. However, problems may arise when a rapidly time-changing magnetic field is applied to the pole pieces. More specifically, because the pole pieces are fabricated from electrically conducting materials during operation of the MRI system, eddy currents may be created, which may generate magnetic fields that oppose the magnetic field being applied.

More specifically, applying a rapidly time-changing magnetic field may also cause a residual or secondary magnetic field to be induced in the pole pieces, which may remain after the applied magnetic field is removed. The eddy currents and the residual magnetization may both distort the applied magnetic field causing the image created from the applied magnetic field to also be distorted.

Accordingly, to facilitate improved operation of the MRI system, at least some known MRI systems include pole pieces which facilitate reducing the distortion of the applied magnetic field. However, such pole pieces are generally fabricated from expensive materials which may not be readily available.

BRIEF DESCRIPTION OF THE INVENTION

In one aspect, an imaging system including at least one pole piece is provided. The at least one pole piece includes at least two grain-oriented sheets that are stacked together, where a direction of easy magnetization of a first of the at least two grain-oriented sheets is different than a direction of easy magnetization of a second of the at least two grain-oriented sheets.

In another aspect, a magnetic resonance imaging (MRI) system is provided. The MRI system includes at least one pole piece. The at least one pole piece includes a plurality of members. At least two grain-oriented sheets are included within each of the members, where a direction of easy magnetization of a first of the at least two grain-oriented sheets is different than a direction of easy magnetization of a second of the at least two grain-oriented sheets.

In yet another aspect, a method for fabricating at least one pole piece for a magnetic resonance imaging (MRI) system is provided. The method includes fabricating at least two grain-oriented sheets, where a direction of easy magnetization of a first of the at least two grain-oriented sheets is different direction than a direction of easy magnetization of a second of the at least two grain-oriented sheets. The method also includes coupling the at least two grain-oriented sheets together to form the pole piece for use in the MRI system.

DETAILED DESCRIPTION OF THE INVENTION

Figure 1:
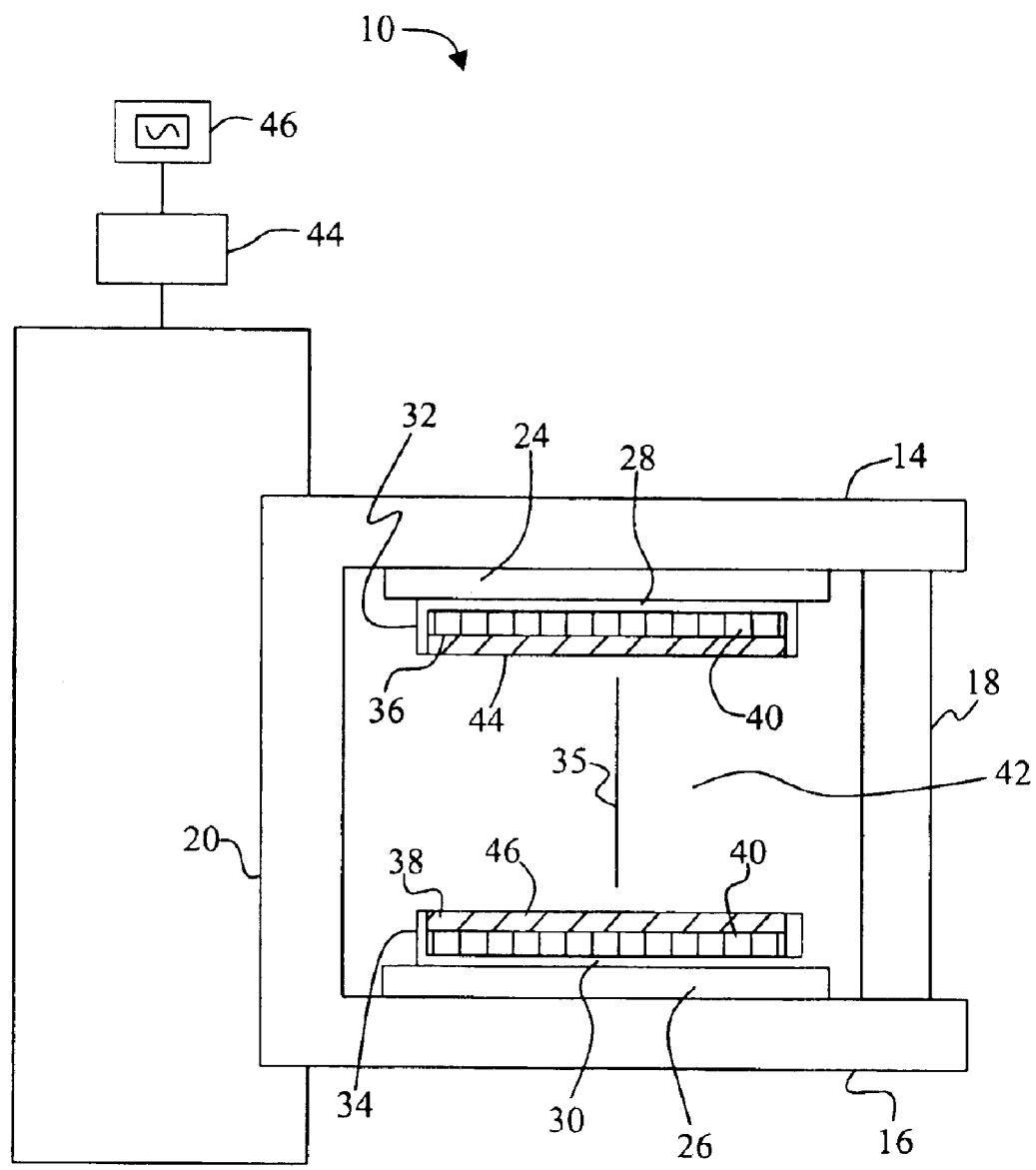
FIG. 1 is a block diagram of an exemplary embodiment of a magnetic resonance imaging (MRI) system including at least one pole piece.
Figure 1:
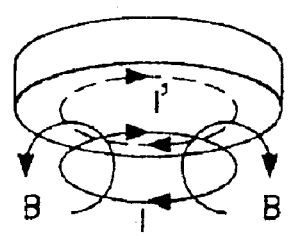

FIG. 1 is a block diagram of an exemplary embodiment of a magnetic resonance imaging (NW) system 10 including at least one pole piece 36 and 38. In the exemplary embodiment, MRI system 10 has two plate yokes 14 and 16, and at least two columnar yokes 18 and 20. In an alternative embodiment, MRI system 10 includes a single "C" shaped yoke. MRI system 10 includes magnets 24 and 26 secured to yoke surfaces such that a line 35 extending through a center of magnets 24 and 26 is substantially perpendicular to magnets 24 and 26. Pole piece bases 28 and 30, and support rings 32 and 34 are secured to respective magnets 24 and 26. Pole pieces 36 and 38 are secured to pole piece bases 28 and 30 and to support rings 32 and 34. Magnets 24 and 26 may include but are not limited to permanent magnets such as RFeB, RCoFeB or SmCo magnets, where R is a rare earth element, electromagnetic magnets, such as a conductive or superconductive coil wrapped around a core, and/or a combination of permanent magnets and the electromagnetic magnets. Pole pieces 36 and 38 include members 40, such as blocks, which are formed as a stack of sheets, as described in more detail below. A gap 42 is formed between pole pieces 36 and 38 and an imaging volume, such as a body part, to be imaged is inserted into gap 42.

MRI system 10 includes gradient coils and/or shims 44 and 46. Furthermore, MRJ system 10 may also optionally include an insulating, low magnetic permeability layer, such as Bakelite, synthetic resin, wood, or ceramic, positioned between pole piece base 28 or 30 and members 40 to facilitate reducing eddy currents and residual magnetization in pole pieces 36 or 38. In addition each member 40 is formed of multiple blocks, described below, where each block is formed of multiple sheets or laminations, described below. A division of each member 40 into multiple blocks and multiple sheets facilitates reducing eddy currents. MRI system 10 also includes electronics 44 and a display 46. Electronics 44 include a control system, a transmitter, a receiver, an imager, or a memory.

Magnetic excitation coils (not shown) create a magnetic flux $B_0$ which is guided through pole pieces 36 and 38. Gradient coils 44 and 46 produce a time-changing magnetic flux B which, when combined with the magnetic flux $B_0$, create a magnetic field gradient extending over the imaging volume. The magnetic flux $B_0$, after passing through the imaging volume, passes through yokes 14, 16, 18, and 20.

Gradient coil 44 has a current I running through it in a direction marked in FIG. 1. Current I creates magnetic flux B which passes through a center of a loop and induces an eddy current I' as shown by a dotted line. Eddy current I' produces another magnetic flux which opposes the magnetic flux B and reduces the effect of the magnetic flux B, and causes disturbances in magnetic flux B and the magnetic field gradient. In a structure with finite electrical conductivity, eddy current I' redistributes and decays with time causing artifacts in an image which depends upon a homogeneous magnetic field gradient when generated from MRI system 10. Generally, the larger a surface area of a structure is, the longer the decay time of eddy current I'. The decay of eddy current r is accelerated by dividing the members 40 into blocks, which may or may not partially overlap, and dividing the blocks into multiple sheets.

Figure 2:
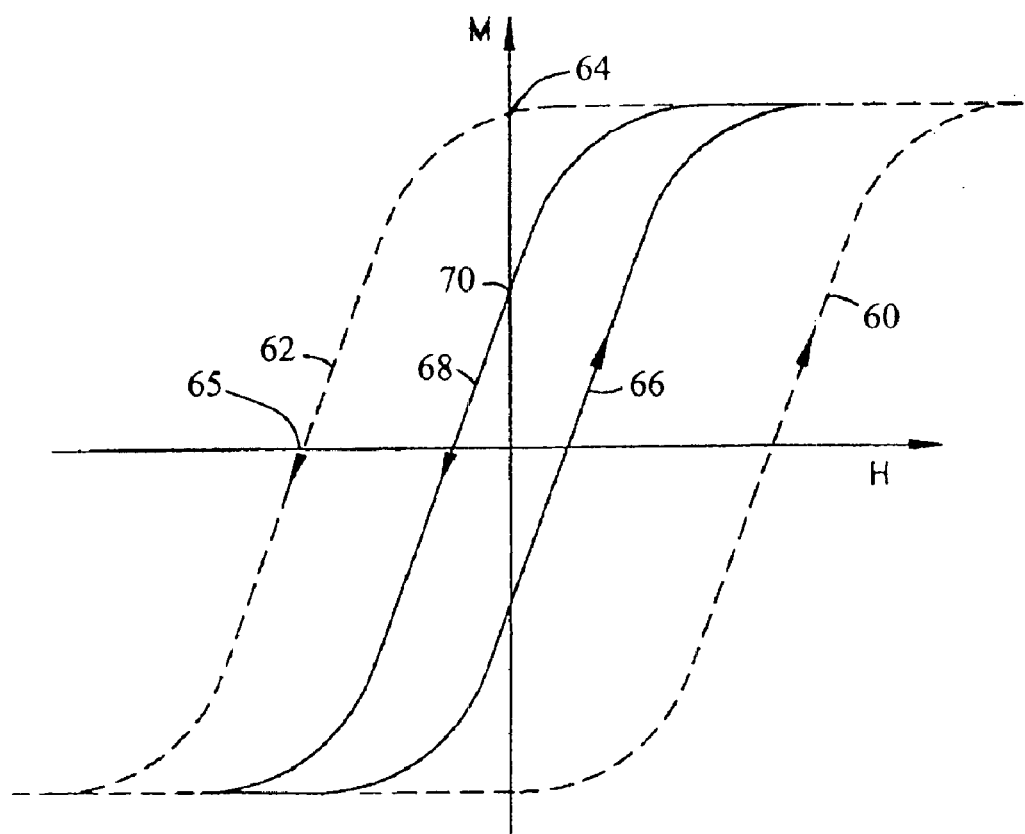
FIG. 2 illustrates exemplary hysteresis effects of various materials used to fabricate pole pieces that may be used with the MRI system of FIG. 1.

FIG. 2 illustrates exemplary hysteresis effects of various materials used to fabricate pole pieces 36 and 38. When a magnetic field H acts upon a material, such as, a magnetic material, field H causes some degree of magnetization M within the material. Moreover, when a material, such as, a permanent magnet, is subjected to the magnetic field H, the resulting magnetization M is shown in a forward direction by path 60. When the magnetic field H is applied in a direction opposite to the forward direction, the magnetization M follows path 62. The degree of magnetization M of a material when it crosses the M axis is called 'residual magnetization' of the material and is indicated in FIG. 2 at point 64. A coercive force of a material is a value of H where a magnetization M of the material crosses the H axis and is indicated in FIG. 2 at point 65. Another magnetic material is shown at traces 66 and 68. Paths 66 and 68 exhibit a lower residual magnetization 70. Relatively speaking, paths 60 and 62 trace a 'harder' magnetic material, as compared to paths 66 and 68.

Residual magnetization is generated from coercive effects in a material, such as a magnetic material. The coercive effects control a magnetization's relaxation to equilibrium when a field component is removed.

In any region of a material, such as a magnetic material, local magnetization is at its maximum or "saturated" value. Local regions where the magnetization is all parallel are called "domains". A thin dividing region between domains where the magnetization direction differs substantially is called a "domain wall". A change in average magnetization as a result of an applied magnetic field can be due to a motion of the domain wall. Alternatively, a change in average magnetization as a result of an applied magnetic field can be due to a rotation of the domain wall. The motion of the domain wall may be impeded by defects, such as holes, inclusions, and boundaries of small crystallites, in the material. The wall impediment leads to hysteresis after a change of an applied magnetic field. An external magnetic field produced by the residual magnetization can perturb an imaging field in MRI system 10 from its desired value, resulting in imaging artifacts.

The motion of the domain wall may be also damped by local eddy currents generated by a change in local magnetization. The dampening effect causes a delay in magnetization change when an applied magnetic field is turned on, and also causes a relaxation in magnetization when the applied magnetic field is removed. The delay is compensated to minimize image artifacts. At least some known imaging systems compensate for the delay but at an expensive cost However, systems and methods described herein facilitate providing a cost effective pole piece that facilitates acceptable image quality at a reasonable cost.

Within a sheet, described below, of magnetic material, the coercive force may depend on the direction of the magnetic flux $B_0$. A direction in which the coercive force is the lowest is called an "easy direction", hereafter referred to as the direction of "easy magnetization". The directionality may be induced during a fabrication of the sheet by a rolling process, tensile straining the material of the sheet, annealing the sheet in an applied magnetic field, or other fabrication process used to manufacture the sheet. A direction perpendicular to the easy direction generally has a higher coercive force than the lowest coercive force.

Materials, described below, may be made in a non-oriented form, which provides a higher coercive force than the lowest coercive force provided by grain-oriented material, described below, along the easy direction. For example, a grain-oriented Si—Fe used in transformer sheets may have a coercive force of 0.1 oerstead in the easy direction while a non-oriented Si—Fe material has a coercive force of 0.5 oerstead. The highest coercive force in the grain-oriented Si—Fe is slightly higher than that of the highest coercive force in the non-oriented Si—Fe material, thereby making the the grain-oriented Si—Fe a preferred material for MRI pole face applications.

Figure 3:
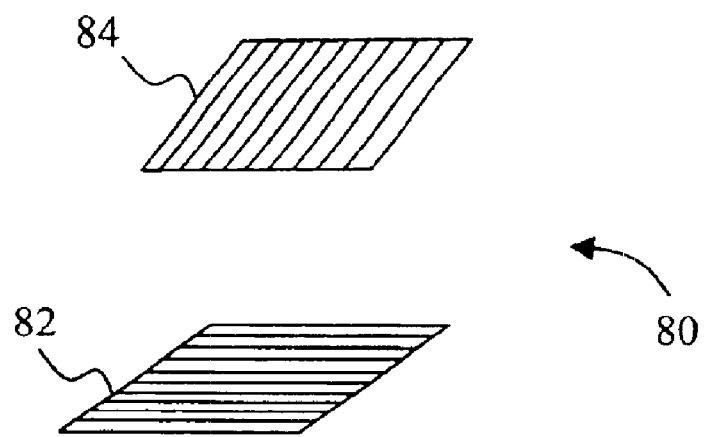
FIG. 3 illustrates an isometric view of an exemplary embodiment of a member of a pole piece that can be implemented in the MRI system shown in FIG. 1.

FIG. 3 illustrates an isometric view of an exemplary embodiment of a member 80 of a pole piece that can be implemented in MRI system 10. Member 80 includes two sheets 82 and 84. A direction of easy magnetization of sheet 82 is substantially perpendicular to line 35 (shown in FIG. 1). A direction of easy magnetization of a sheet is represented as lines drawn within sheets and is the same as a direction in which crystalline structures within the sheet are oriented. A direction of easy magnetization of sheet 84 is substantially perpendicular to line 35 and is also substantially perpendicular to the direction of easy magnetization of sheet 82. Accordingly, a coercive force present within sheet 82 to move the domain wall is less than a coercive force present within sheet 84. For example, in one embodiment, a coercive force present within sheet 82 is 0.1 oerstead and a coercive force present within sheet 84 is between 0.4 and 0.5 oersteads.

Each sheet 82 and 84 is fabricated from materials having grain-oriented crystalline structures. For example, in one embodiment, sheet 82 is fabricated from materials, such as, including, but not limited to, alloys of iron and aluminum, a combination of iron, aluminum and silicon, a combination of nickel and iron, or a combination of iron and silicon. Sheet 84 can be fabricated from the same, or different, materials as which sheet 82. Each sheet 82 and 84 is covered with an epoxy or other adhesives and then coupled together. Once sheets 82 and 84 are covered, the sheets are coupled to each other by pressing the sheets against each other and in a direction substantially perpendicular to line 35.

Any number of sheets can be stacked together to form member 80 provided the lamination pattern is repeated. For example, a third sheet having a direction of easy magnetization substantially parallel to a direction of easy magnetization of sheet 82 may be stacked against sheet 84 in a direction substantially perpendicular to line 35. In the example, the direction of easy magnetization of the third sheet would be substantially perpendicular to the direction of easy magnetization of sheet 84. Moreover, in the example, a coercive force present within the third sheet to move the domain wall would be approximately the same amount as that present within sheet 82.

Figure 4:
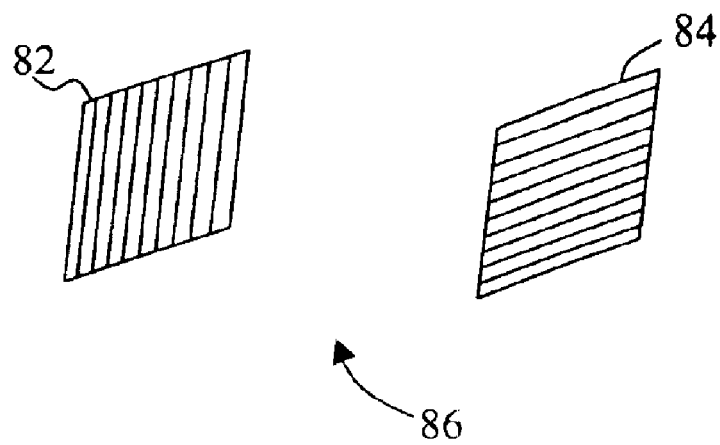
FIG. 4 illustrates an isometric view of an alternative embodiment of the member shown in FIG. 3.

As another example, a fourth sheet having a direction of easy magnetization that is substantially parallel to the direction of easy magnetization of sheet 84 is stacked against the third sheet in a direction substantially perpendicular to line 35. In the example, the direction of easy magnetization of the fourth sheet is substantially perpendicular to the direction of easy magnetization of sheet 82. Moreover, in the example, a coercive force present within the fourth sheet to move the domain wall is approximately of the same amount as that present within sheet 84. For instance, if a coercive force present within sheet 84 is between 0.4 and 0.5 oersteads, a coercive force present within the fourth sheet is also between 0.4 and 0.5 oersteads. Sheets 82 and 84, and the third and fourth sheets can be stacked in any order. For example, the third sheet is stacked below and adjacent to sheet 82, and the fourth sheet is stacked above and adjacent to sheet 84. FIG. 4 illustrates an isometric view of an alternative embodiment of a member 86 of a pole piece of MRI system 10 in which sheets 82 and 84 are stacked and coupled together in a direction that is substantially parallel to line 35. It should be noted that any number of sheets can be stacked together to form member 86, and as described herein, the order in which the sheets are stacked together within member 86 can vary.

Figure 5:
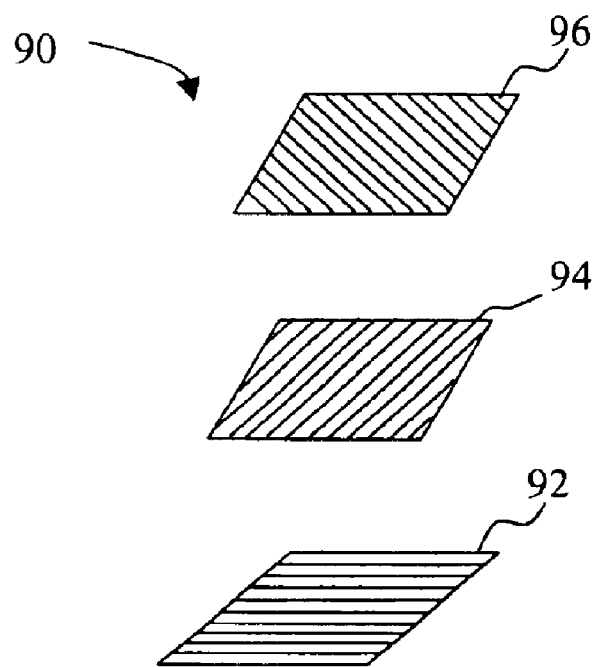
FIG. 5 illustrates an isometric view of an alternative embodiment of a member of a pole piece that can be implemented in the MRI system shown in FIG. 1.

FIG. 5 illustrates an isometric view of an alternative embodiment of a member 90 of a pole piece that can be implemented in MRI system 10. Member 90 includes three sheets 92, 94, and 96. A direction of easy magnetization of sheet 92 is substantially perpendicular to line 35 between magnets 24 and 26. A direction of easy magnetization of sheet 94 is substantially perpendicular to line 35 and forms an angle of approximately sixty degrees relative to the direction of easy magnetization of sheet 92. A coercive force present within sheet 94 to move the domain wall is greater than a coercive force present within sheet 92. Each sheet 92, 94, and 96 is fabricated from materials, listed above, having grain-oriented crystalline structures. Sheet 94 is stacked against sheet 92 and in a direction substantially perpendicular to line 35.

A direction of easy magnetization of sheet 96 is substantially perpendicular to line 35 and forms an angle of approximately of sixty degrees relative to the direction of easy magnetization of sheet 94. A coercive force present within sheet 96 is greater than the coercive force present within sheet 92. Sheet 96 is stacked against sheet 94 and in a direction substantially perpendicular to line 35.

Any number of sheets made of materials listed above having grain-oriented crystalline structures can be stacked against each other to form member 90. For example, a fourth sheet having a direction of easy magnetization of approximately sixty degrees relative to the direction of easy magnetization of sheet 96 is stacked against sheet 96. The fourth sheet is stacked in a direction substantially perpendicular to line 35. Moreover, in the example, a coercive force present within the fourth sheet to move the domain wall is of the same amount as that present within sheet 92. For instance, if a coercive force present within sheet 92 is 0.1 oerstead, a coercive force present within the fourth sheet is also 0.1 oerstead. Similarly, additional sheets can be stacked on top the fourth sheet, where a direction of easy magnetization of each of the sheets is at an angle of approximately sixty degrees with respect to a direction of easy magnetization of a sheet adjacent and below each of the sheets. Sheets 92, 94, and 96, and the fourth sheet can be stacked in any order. For example, the fourth sheet is stacked below sheet 92.

Figure 6:
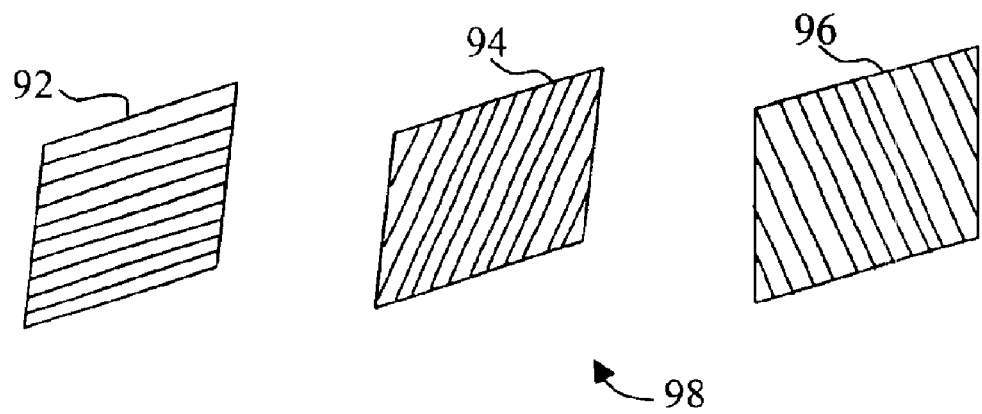
FIG. 6 illustrates an isometric view of an alternative embodiment of the member shown in FIG. 5.

FIG. 6 illustrates an isometric view of an exemplary embodiment of a member 98 of a pole piece of MRI system 10 in which sheets 92, 94, and 96 are stacked and coupled together in a direction substantially parallel to line 35. Any number of sheets can be stacked within member 98. Moreover, the order in which sheets are stacked within member 98 can change.

Figure 7:
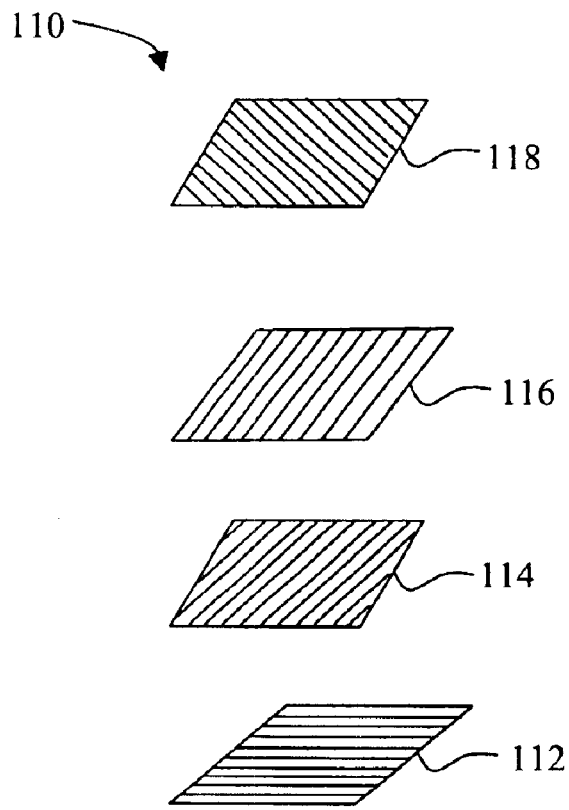
FIG. 7 illustrates an isometric view of another alternative embodiment of a member of a pole piece that can be implemented in the MRI system shown in FIG. 1.

FIG. 7 illustrates an isometric view of an alternative embodiment of a member 110 of a pole piece that can be implemented in MRI system 10. Member 110 includes four sheets 112, 114, 116, and 118. A direction of easy magnetization of sheet 112 is substantially perpendicular to line 35 between magnets 24 and 26. A direction of easy magnetization of sheet 114 is substantially perpendicular to line 35 and forms an angle of approximately forty-five degrees with respect to the direction of easy magnetization of sheet 112. A coercive force present within sheet 114 to move the domain wall is greater than a coercive force present within sheet 112. Each sheet 112, 114, 116, and 118 is fabricated from materials, listed above, having grain-oriented crystalline structures. Sheet 114 is stacked against sheet 112 and in a direction substantially perpendicular to line 35.

A direction of easy magnetization of sheet 116 is substantially perpendicular to line 35 and forms an angle of approximately forty-five degrees with respect to the direction of easy magnetization of sheet 114. A coercive force present within sheet 116 to move the domain wall is greater than the coercive force present within sheet 112. For example, if a coercive force present within sheet 112 is 0.1 oerstead, a coercive force present within sheet 116 ranges between 0.4 and 0.5 oersteads. Sheet 116 is stacked against sheet 114 and in a direction substantially perpendicular to line 35.

A direction of easy magnetization of sheet 118 is substantially perpendicular to line 35 and forms an angle of approximately forty-five degrees with respect to the direction of easy magnetization of sheet 116. A coercive force present within sheet 118 to move the domain wall is greater than a coercive force present within sheet 112. Sheet 118 is stacked against sheet 116 and in a direction substantially perpendicular to line 35.

Any number of sheets made of materials listed above having grain-oriented crystalline structures can be stacked against each other to form member 110. For example, a fifth sheet having a direction of easy magnetization forming an angle of approximately forty-five degrees relative to the direction of easy magnetization of sheet 118 is stacked against sheet 118. The fifth sheet is stacked in a direction substantially perpendicular to line 35. Moreover, in the example, a coercive force present within the fifth sheet is of the same amount as that present within sheet 112. For instance, if a coercive force present within sheet 112 is 0.1 oerstead, a coercive force present within the fifth sheet is also 0.1 oerstead. Similarly, additional sheets can be stacked on top the fifth sheet, where a direction of lamination of each of the sheets is approximately at a forty-five degree angle with respect to a direction of lamination of a sheet adjacent and below each of the sheets. Sheets 112, 114, 116, and 118, and the fifth sheet can be stacked in any order. For example, the fifth sheet is stacked below sheet 112.

Figure 8:
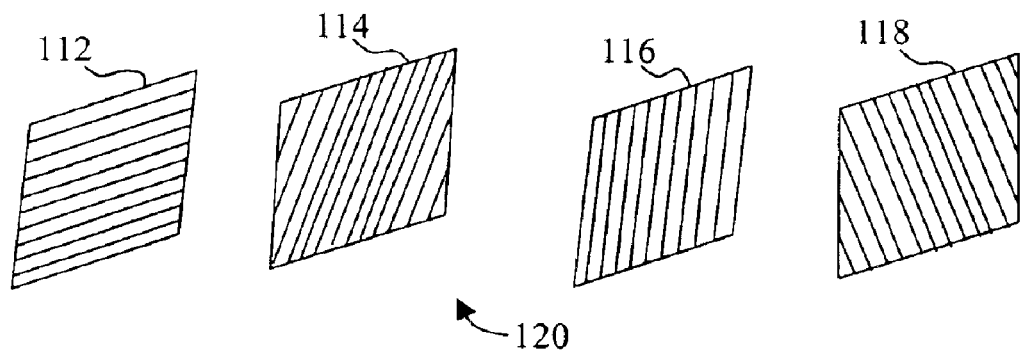
FIG. 8 illustrates an isometric view of an alternative embodiment of the member shown in FIG. 7.

FIG. 8 illustrates an isometric view of an alternative embodiment of a member 120 of a pole piece of MRI system 10 in which sheets 112, 114, 116, and 118 are stacked and coupled together in a direction substantially parallel to line 35. Any number of sheets can be stacked within member 120. Moreover, the order in which sheets are stacked within member 120 can change.

In alternative embodiments, each sheet in a stack of sheets has a direction of easy magnetization, such as, for instance, approximately twenty two and a half degrees, with respect to a direction of easy magnetization of a sheet that lies adjacent and below each sheet. The sheets in the stack are made from materials listed above having grain-oriented crystalline structures.

Figure 9:
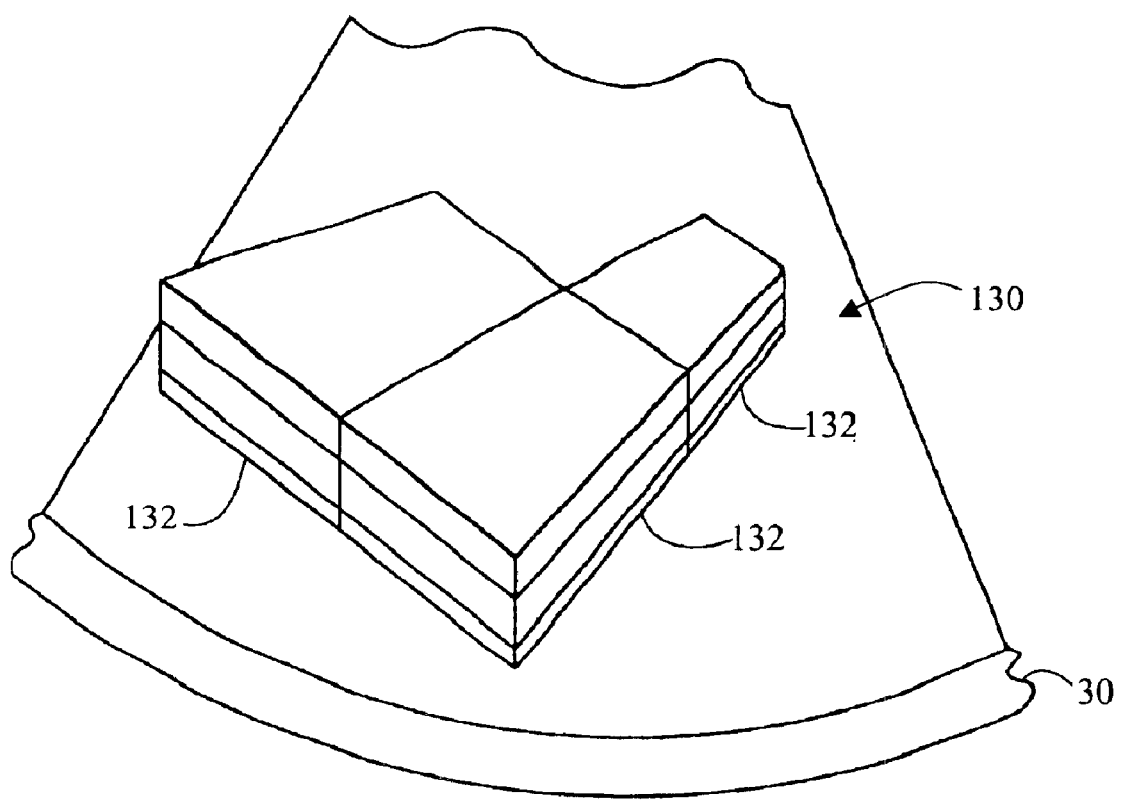
FIG. 9 illustrates an exemplary embodiment of a pole piece in which members are stacked on a pole piece base.

FIG. 9 illustrates an exemplary embodiment of a pole piece 130 in which members 132 are stacked on pole piece base 30 in a direction substantially perpendicular to line 35. Any of members 80, 86, 90, 98, 110, and 120 can be stacked in a similar manner as shown in FIG. 9. Members 132 are coupled to pole piece base 30 and to each other by a substance, such as an epoxy.

Figure 10:
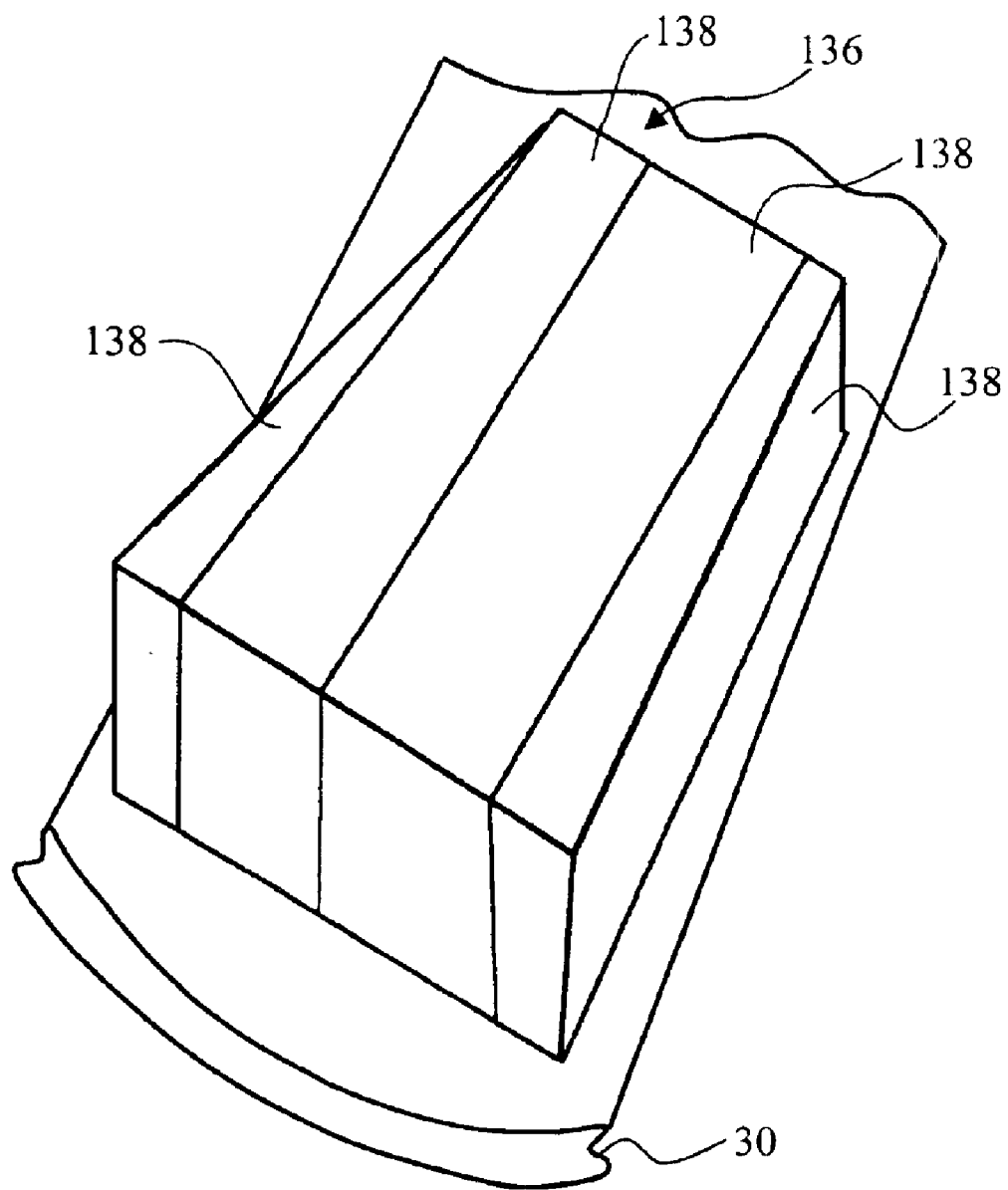
FIG. 10 illustrates an alternative embodiment of a pole piece in which members are stacked on the pole piece base.

FIG. 10 illustrates an exemplary embodiment of a pole piece 136 in which members 138 are stacked on pole piece base 30 in a direction substantially parallel to line 35. Any of members 80, 86, 90, 98, 110, and 120 can be stacked in a similar manner as shown in FIG. 10. Members 138 are coupled to pole piece base 30 and to each other by a substance, such as an epoxy. In alternative embodiments, members 130 are stacked on top or below members 138, where members 130 are stacked substantially parallel to line 35 and members are stacked substantially perpendicular to line 35.

The herein described systems and methods can be used effectively by placing adjacent sheets at different grain-orientations with respect to the other. When pole pieces 36 and 38 are excited by gradient coils 44 and 46, some of the adjacent sheets whose easy direction is closest to that of the magnetic flux $B_o$ will carry the most amount of the magnetic flux $B_0$ since they will have a lower coercive force than coercive forces of remaining adjacent sheets and a higher magnetic permeability than magnetic permeability of the remaining adjacent sheets. The remaining adjacent sheets are referred to as higher coercive force sheets. The lower coercive force and the higher magnetic permeability limits a level of excitation of the higher coercive force sheets, thereby limiting a level of excitation of the adjacent sheets that would otherwise be driven to their maximum coercive forces. When the time changing magnetic flux $B_o$ is removed, the residual magnetization seen within the imaging volume placed in gap 42 will be a mixture of that produced by local coercive fields, including lower and higher coercive fields, within the domains of the adjacent sheets. Interaction between the adjacent sheets impacts the mixture. Some of the higher coercive fields excites some of the lower coercive fields, raising coercive forces within the lower coercive fields by a reluctance of a flux produced by a difference in the higher and the lower coercive fields. At the same time, the lower coercive fields reduce an amount of flux available from the higher coercive fields which can excite the imaging volume within gap 42. A net result of the reductions by the higher and the lower coercive fields is a lower overall residual magnetization than residual magnetization from non-oriented materials.

The net result can be achieved by alternating grain-oriented sheets having a higher coercive force and a lower coercive force. Such an alternating arrangement creates a "bulk" material that has a coercive force that is higher than the lower coercive force but has a coercive force lower than the higher coercive force. The alternating arrangement has a lower material cost than that of a single sheet whose coercive force is equivalent to that of the alternating arrangement.

Technical effects or benefits of the systems and methods for fabricating pole pieces for magnetic resonance imaging system 10 include providing pole pieces having acceptable magnetic properties at a reasonable cost. Pole pieces implemented in MRI system 10 have acceptable magnetic properties since although some sheets, such as, sheets 84, 94, 96, 114, 116, and 118, carry minimal magnetic flux generated by magnets 24 and 26, sheets, such as, sheets 82, 92, and 112, carry most of the magnetic flux. The pole pieces can be manufactured at a reasonable cost because the materials with grain-oriented crystalline structures can be readily obtained at a reasonable cost. It is noted that although square shaped sheets are shown in FIGS. 4, 5, 6, 7, 8, and 9, sheets of other shapes, such as a rectangular shape, can be used in the herein described systems and methods.

Hence, the herein described systems and methods help develop pole pieces of MRI systems at a reasonable cost. Moreover, the herein described systems and methods help develop pole pieces of MRI systems from materials readily available.

An exemplary embodiment of an MRI system is described above in detail. The MRI system components illustrated are not limited to the specific embodiments described herein, but rather, components of each MRI system may be utilized independently and separately from other components described herein. For example, the MRI system components described above may also be used in combination with other imaging systems.

While the invention has been described in terms of various specific embodiments, those skilled in the art will recognize that the invention can be practiced with modification within the spirit and scope of the claims.

What is claimed is:

1. A magnetic resonance imaging (MRI) system comprising:
   at least one pole piece including a plurality of members; and
   at least two grain-oriented sheets included within each of the members, wherein a direction of easy magnetization of a first of the at least two grain-oriented sheets is different than a direction of easy magnetization of a second of the at least two grain-oriented sheets.

2. An MRI system in accordance with claim 1 further comprising a third grain-oriented sheet stacked together with the first and the second grain-oriented sheets, wherein the direction of easy magnetization of the second grain-oriented sheet forms an angle of approximately sixty degrees relative to the direction of easy magnetization of the first grain-oriented sheet, and a direction of easy magnetization of the third grain-oriented sheet forms an angle of approximately sixty degrees relative to the direction of easy magnetization of the second grain-oriented sheet.

3. An MRI system in accordance with claim 2 wherein the second grain-oriented sheet is between the first and third grain-oriented sheets.

4. An MRI system in accordance with claim 1 further comprising a third grain-oriented sheet stacked together with the first and the second grain-oriented sheets, wherein the direction of easy magnetization of the second grain-oriented sheet forms an angle of approximately forty-five degrees relative to the direction of easy magnetization of the first grain-oriented sheet, and a direction of easy magnetization of the third grain-oriented sheet forms an angle of approximately forty-five degrees relative to the direction of easy magnetization of the second grain-oriented sheet.

5. An MRI system in accordance with claim 1 further comprising at least a pair of oppositely-facing magnets, each of the magnets having a center, the at least two sheets are stacked in a direction substantially parallel to a line extending substantially perpendicularly to the magnet centers.

6. An MRI system in accordance with claim 1 further comprising at least a pair of oppositely-facing magnets, each of the magnets having a center, the at least two sheets are stacked in a direction substantially perpendicular to a line extending substantially perpendicularly to the magnet centers.

7. An MRI system in accordance with claim 1 wherein each of the at least two sheets is fabricated from grain-oriented materials, wherein the grain-oriented materials include at least one of iron and aluminum, a combination of iron, aluminum and silicon, a combination of nickel and iron, and a combination of iron and silicon.

8. An MRI system in accordance with claim 1 wherein the second grain-oriented sheet has a coercive force that is greater than a coercive force of the first grain-oriented sheet.

9. An imaging system comprising at least one pole piece comprising at least two grain-oriented sheets that are stacked together, wherein a direction of easy magnetization of a first of the at least two grain-oriented sheets is different than a direction of easy magnetization of a second of the at least two grain-oriented sheets.

10. An imaging system in accordance with claim 1 further comprising a third grain-oriented sheet stacked together with the first and the second grain-oriented sheets, wherein the direction of easy magnetization of the second grain-oriented sheet forms an angle of approximately sixty degrees relative to the direction of easy magnetization of the first grain-oriented sheet, and a direction of easy magnetization of the third grain-oriented sheet forms an angle of approximately sixty degrees relative to the direction of easy magnetization of the second grain-oriented sheet.

11. An imaging system in accordance with claim 10 wherein the second grain-oriented sheet is between the first and third grain-oriented sheets.

12. An imaging system in accordance with claim 1 further comprising a third grain-oriented sheet stacked together with the first and the second grain-oriented sheets, wherein the direction of easy magnetization of the second grain-oriented sheet forms an angle of approximately forty-five degrees relative to the direction of easy magnetization of the first grain-oriented sheet, and a direction of easy magnetization of the third grain-oriented sheet forms an angle of approximately forty-five degrees relative to the direction of easy magnetization of the second grain-oriented sheet.

13. An imaging system in accordance with claim 9 further comprising at least a pair of oppositely-facing magnets, each of the magnets having a center, the at least two sheets are stacked in a direction substantially parallel to a line extending substantially perpendicularly to the magnet centers.

14. An imaging system in accordance with claim 9 further comprising at least a pair of oppositely-facing magnets, each of the magnets having a center, the at least two sheets are stacked in a direction substantially perpendicular to a line extending substantially perpendicularly to the magnet centers.

15. An imaging system in accordance with claim 9 wherein each of the at least two sheets is fabricated from grain-oriented materials, wherein the grain-oriented materials include at least one of iron and aluminum, a combination of iron, aluminum and silicon, a combination of nickel and iron, and a combination of iron and silicon.

16. An imaging system in accordance with claim 9 wherein the second grain-oriented sheet has a coercive force that is greater than a coercive force of the first grain-oriented sheet.

* * * * *